United States Patent [19]

Kuo et al.

[11] 4,385,432

[45] May 31, 1983

[54] CLOSELY-SPACED DOUBLE LEVEL CONDUCTORS FOR MOS READ ONLY

[75] Inventors: Chang-Kiang Kuo, Houston; Shyh-Chang Tsaur, Stafford, both of Tex.

[73] Assignee: Texas Instruments Incorporated, Dallas, Tex.

[21] Appl. No.: 907,236

[22] Filed: May 18, 1978

[51] Int. Cl.³ .................................... H01L 21/28
[52] U.S. Cl. ........................... 29/571; 29/577 C; 29/591; 148/187
[58] Field of Search ............... 29/571, 577, 577 C, 29/591; 357/45

[56] References Cited

U.S. PATENT DOCUMENTS

| | | | |
|---|---|---|---|
| 3,225,261 | 12/1965 | Wolf | 357/45 |
| 4,097,885 | 6/1978 | Walsh | 357/59 |
| 4,099,317 | 7/1978 | Su | 29/571 |
| 4,143,178 | 3/1979 | Harada et al. | 29/571 X |
| 4,151,020 | 4/1979 | McElroy | 29/577 C |
| 4,347,656 | 9/1982 | Smith et al. | 29/571 X |

*Primary Examiner*—G. Ozaki
*Attorney, Agent, or Firm*—John G. Graham

[57] ABSTRACT

Closely-spaced conductors can be used in a semiconductor integrated circuit such as an MOS read only memory or ROM formed by a process compatible with standard N-channel silicon gate manufacturing methods. Address lines and gates are polysilicon strips, and output and ground lines are defined by elongated N+ regions. To allow the spacing between adjacent polysilicon address lines to be closer, alternate rows employ first or second level polysilicon which can even overlap if necessary. Each potential MOS transistor in the array is programmed to be a logic "1" or "0", such as by ion implanting through the polysilicon gates and thin gate oxide.

7 Claims, 11 Drawing Figures

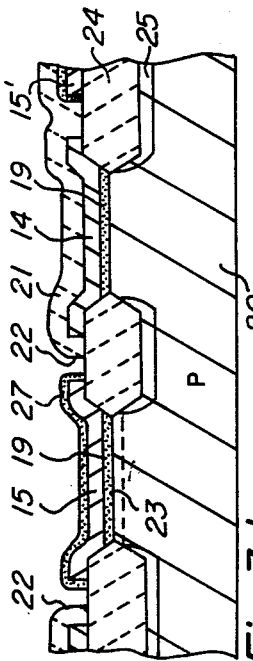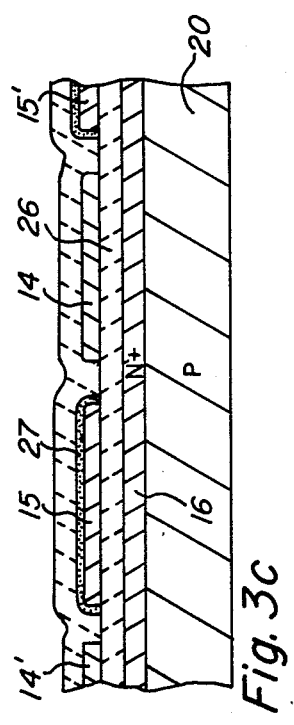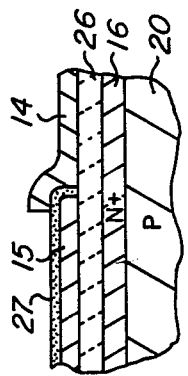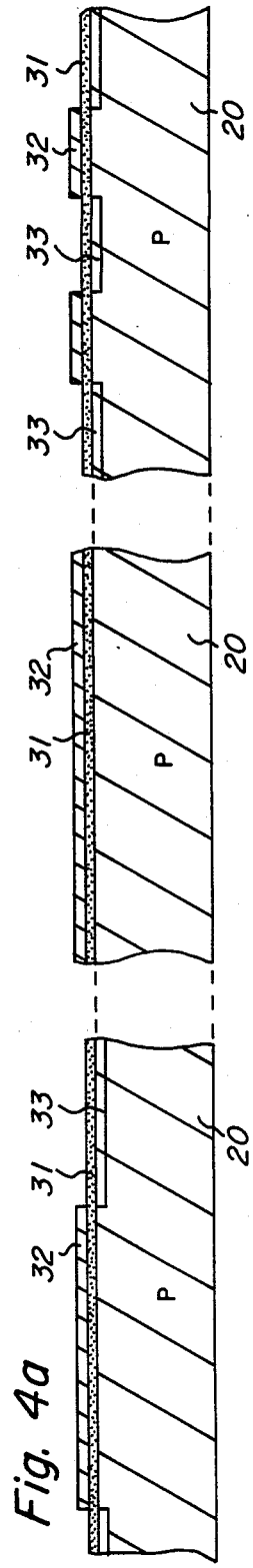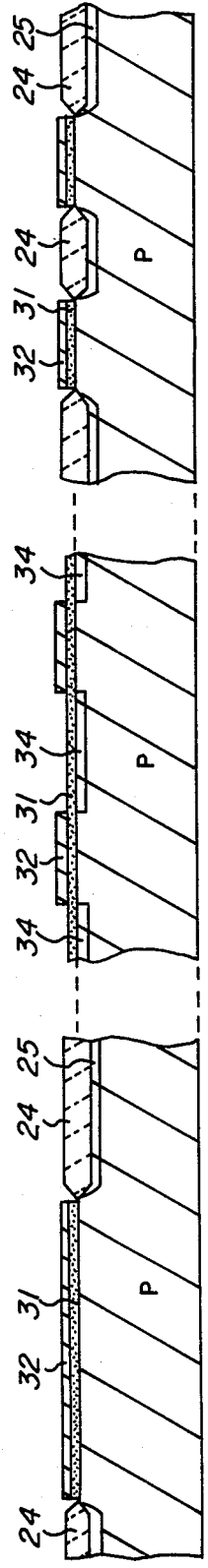

CLOSELY-SPACED DOUBLE LEVEL CONDUCTORS FOR MOS READ ONLY

BACKGROUND OF THE INVENTION

This invention relates to semiconductor memory devices, and more particularly to an N-channel silicon gate MOS read only memory and a process for making it.

Storage of fixed programs in digital equipment such as minicomputers and microprocessor systems is usually provided by MOS read only memory devices or "ROMs". The economics of manufacture of semiconductor devices such as ROMs, and of mounting them on circuit boards in the system, are such that the number of memory bits per semiconductor chip is advantageously as high as possible. ROMs of up to 32K bits (32,768) are typical at present. Within a few years, standard sizes will progress through 64K, 128K, 256K and 1 megabit. This dictates that cell size for the storage cells of the ROM be quite small. Metal gate ROMs of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the process. N-channel ROMs are disclosed in prior applications Ser. Nos. 762,612, filed Jan. 26, 1977, now U.S. Pat. No. 4,151,020, 890,555, now U.S. Pat. No. 4,290,184, 890,556, and 890,557 now U.S. Pat. No. 4,198,693, filed Mar. 20, 1978, all assigned to Texas Instruments. A series ROM and method of programming is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip. A problem encountered when the cell size is reduced is that the spacing between parallel adjacent conductors such as the metal or polysilicon row lines wastes area; this space is nonfunctional other than for manufacturing tolerance.

It is the principal object of this invention to provide a semiconductor device such as a permanent store memory cell of small size. Another object is to provide a small-area memory cell which is made by a process compatible with standard N-channel silicon gate manufacturing techniques.

SUMMARY OF THE INVENTION

In accordance with an embodiment of the invention, a semiconductor device such as a metal-oxide-semiconductor read only memory, or MOS ROM, is formed in an integrated circuit along with other silicon gate transistors for the peripheral circuitry. The ROM is an array of potential MOS transistors where adjacent parallel polysilicon strips on a silicon bar define the address lines and gates, and output and ground lines are defined by elongated N+ regions. In the array, each potential MOS transistor is a storage cell, each cell being programmed to store a logic "1" or "0". The strips are applied by a double level polysilicon process, alternate lines being first or second level poly so that adjacent lines may be touching or overlapping.

BRIEF DESCRIPTION OF THE DRAWINGS

The novel features believed chacteristic of the invention are set forth in the appended claims. The invention itself, however, as well as other features and advantages thereof, will be best understood by reference to the detailed description which follows, read in conjunction with the accompanying drawings, wherein:

FIGS. 3a–3d are elevation views in section of the cell of FIG. 1, taken along the lines a—a, b—b, c—c, and d—d, respectively; and FIGS. 4a–4e are elevation views in section of the ROM array and a transistor in the peripheral part of the semiconductor device of FIGS. 1 and 3a–3d, at successive stages in the manufacturing process, taken generally along the line a—a in FIG. 1.

DETAILED DESCRIPTION OF SPECIFIC EMBODIMENTS

Figure 1:
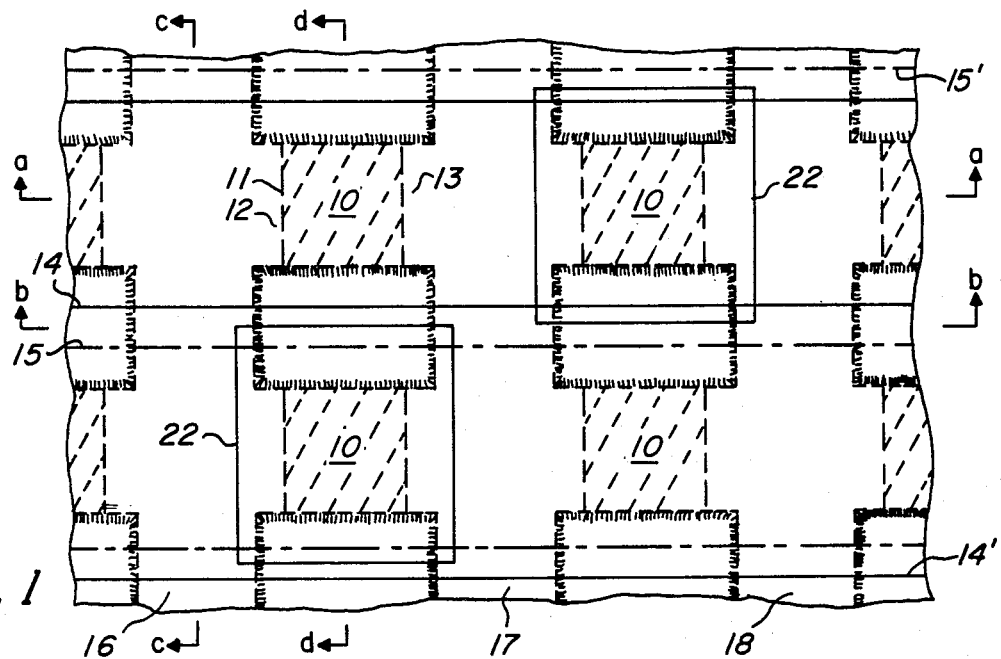
FIG. 1 is a greatly enlarged plan view of a small portion of a semiconductor chip showing the physical layout of a part of a ROM array made according to the invention.
Figure 2:
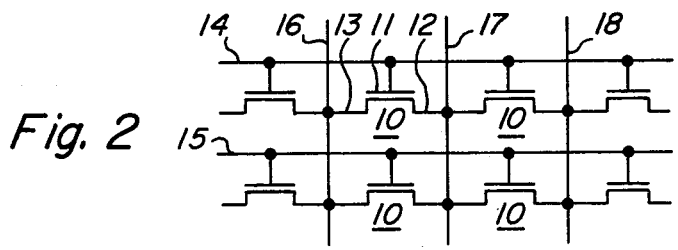
FIG. 2 is an electrical schematic diagram of the ROM of FIG. 1.

With reference to FIGS. 1, 2, and 3a–3d, a read only memory is illustrated which uses the double level adjacent conductors according to the invention. The array consists of a large number of cells 10, only four of which are shown. Each cell is an MOS transistors having a gate 11, a source 12 and a drain 13. The gates 11 are parts of alternate first or second level polysilicon strips 14 and 15 which are the X address lines for the array. The sources and drains are part of N+ diffused regions 16, 17, and 18 which are Y output and ground lines. The array, formed on a silicon bar 20, would typically contain perhaps 64K, 128K or 256K cells, so the bar would be much less than about 200 mils on a side or 40,000 sq. mil area depending upon the bit density. The four cells 10 shown would be on a minute part of the bar, perhaps about one mil wide. A 64K ROM would require 256 of the X address lines such as 14 and 15 and 256 of the Y lines like the lines 16 to 18, providing 65,536 bits. Although no Vss or ground lines are shown, it is preferable that the array is of a virtual ground type as disclosed in U.S. Pat. No. 3,934,233, issued to Roger J. Fisher and Gerald D. Rogers or U.S. Pat. No. 4,021,781 issued to Edward R. Caudel both assigned to Texas Instruments, in which case one Vss line for each eight or sixteen Y lines would be needed. Alternatively, the array is of a virtual ground type wherein no dedicated ground lines are used, but instead one Y line adjacent a selected cell is selected as ground, depending upon the Y address. The Y line on the other side of the selected cell is the Y output line, all this being defined by the Y decoder.

The cell array may be programmed by boron implant, either through the polycrystalline silicon strips 14 and 15 and the gate oxide 19 or prior to deposition of the poly, to raise the threshold voltage of selected ones of the cells 10 to a value above that which will be turned on by the voltage on the selected address line 14, 15, etc. In the example of four complete cells shown, the upper right cell and the lower left cell are implanted in this manner, the others are not. A thick protective oxide layer 21 may be used as the implant mask if implant programming is used, with apertures 22 etched in the layer 21 above the cells 10 which are to be implanted. The layer 21 is non-thermal oxide deposited at low temperature in accord with standard MOS manufacturing methods. Usually this oxide covers everything except the bonding pads on a bar. The ion implant creates implanted regions 23 in the channel areas of the selected transistors 10. The regions 23 are doped more heavily P-type than the original silicon substrate 20.

A thick field oxide coating 24 covers parts of the bar not occupied by the transistors or diffused interconnects, and P+ channel stop regions 25 are formed underneath all the thick field oxide. A thinner field oxide coating 26 covers the N+ diffused regions 16, 17 and 18. No metal lines are used in the cell array, only in the peripheral areas.

Figure 3A:
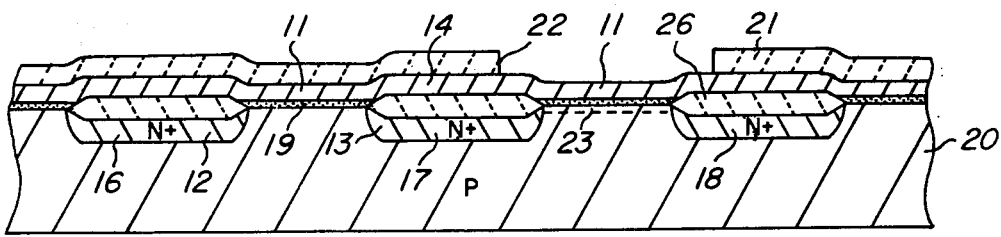
Figure 3B:
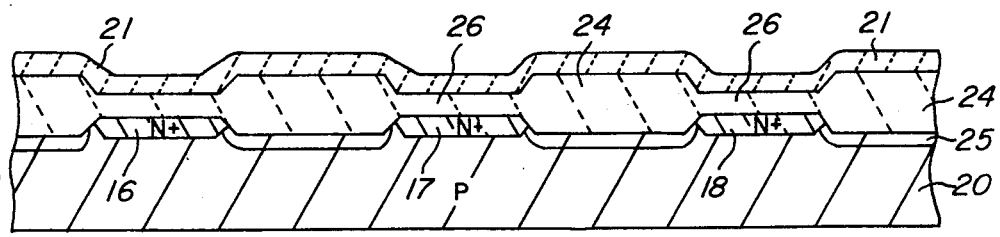

According to the invention, the polysilicon lines 14 and 15 are applied in two separate deposition operations. Line 15, and other lines 15', etc., which comprise every alternate X address line in the array for a total of 128 in a 256×256 or 64K array, one first level poly. Interleaved with the first level poly lines are the lines 14, 14' and all of the remaining 128 X lines, which are second level poly deposited and patterned after the first level poly has been patterned. In the past, all of the X lines were deposited and patterned at the same time because of optical and chemical processing limitations, the minimum spacing between adjacent contractor lines is usualy about the same as the width of the lines. That is, if the design rules dictate a minimum width of polysilicon lines of 5 microns, the minimum spacing between two adjacent poly lines would be 5 microns; closer spacing would cause optical resolution problems, blurring of the edges, etc., in the photolithographic operation, and undercutting and other process related problems in the developing and preferential etching operations including shorts between lines which are so close together that bridges occur when etching is attempted. In contrast, using the concept of this invention, the two adjacent lines 14 and 15 can be as close as needed, even touching or overlapping as seen in FIG. 3a, and no such problems occur because during each of the separate photolithographic operations the closest lines are spaced wide apart. A thermal oxide coating 27 insulates the two levels of polysilicon from one another and also functions as an etch resistant coating when patterning the second level poly.

Turning now to FIGS. 4a-4e, a process for making the ROM array of the invention will be described. The right hand side of these FIGURES corresponds to the section view of FIG. 3a, while the left hand side shows the formation of an N-channel silicon gate transistor of conventional form on the periphery of the chip, i.e., not in the cell array. The starting material is a slice of P-type monocrystalline silicon, typically 3 inches in diameter and twenty mils thick, cut on the -100- plane, of a resistivity of about 6 to 8 ohm-cm. As above, in the FIGURES the portion shown of the bar 20 represents only a very small part of the slice, perhaps less than one mil wide for each part. After appropriate cleaning, the slice is oxidized by exposing to oxygen in a furnace at an elevated temperature of perhaps 1100 degrees C. to produce an oxide layer 31 over the entire slice of a thickness of about 1000 Angstroms. Parts of this layer 31 may stay in place to become the gate insulator areas 19, but usually the layer is later removed and new gate oxide grown. Next, a layer 32 of silicon nitride of about 1000 Angstroms thickness is formed over the entire slice by exposing to an atmosphere of dichlorosilane and ammonia in a CVD reactor. A coating of photoresist is applied to the entire top surface of the slice, then exposed to ultraviolet light through a mask which defines the desired pattern of the thick field oxide 24 and the P+ channel stop 25. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per sq. cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

The next step in the process is formation of field oxide 24, which is done by subjecting the slices to steam or an oxidizing atmosphere at about 900 degrees C. for perhaps five hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 6000 Angstroms, about half of which is above the original surface and half below. The boron doped P+ regions 33 formed by implant will be partly consumed, that will also diffuse further into the silicon ahead of the oxidation front. Thus, P+ field stop regions 25 will result which will be much deeper than the original regions 33. At this point, the field oxide layer 24 is not nearly as thick as it will be in the finished device. Additional thickness results from subsequent heat treatments.

The slice is now coated with another photoresist layer and then exposed to ultraviolet light through a mask which defines the source and drain areas 12 and 13 as well as the lines 16, 17 and 18 which are to be N+ diffused. After developing the slice is again subjected to a nitride etchant which removes the parts of the nitride layer 32 now exposed by holes in the photoresist. The parts of the oxide layer 31 bare after this nitride is removed are then etched to expose the silicon surface. A phosphorus diffusion produces the N+ regions 34 which will subsequently become the sources, drains, etc. Instead of diffusion, these N+ regions 34 may be formed by ion implant, in which case the oxide layer 31 would be left in place and an anneal step used before the subsequent oxidation.

Figure 4C:
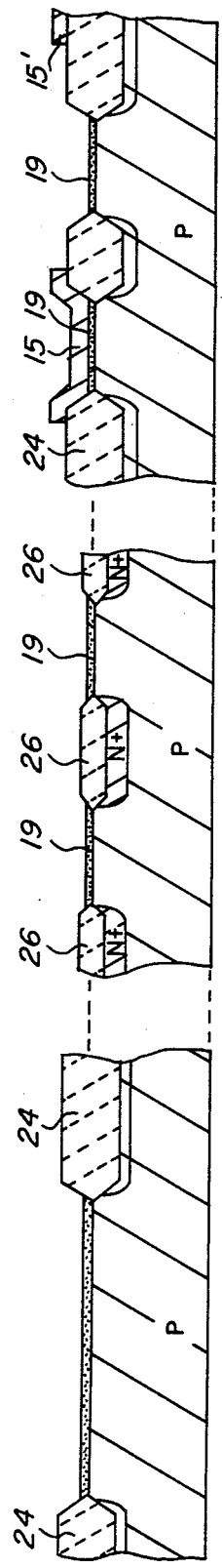

Referring to FIG. 4c, a second field oxidation step is now performed by placing the slice in steam or dry oxygen at about 1000 degrees C. for several hours. This oxidizes all of the top of the slice not covered by the remaining parts of the nitride layer 32, producing field oxide 26 which is about 5000 Angstroms thickness. During this oxidation, the areas of field oxide 24 grow thicker, to perhaps 10,000 Angstroms. The N+ regions 34 are partly consumed but also diffuse further into the silicon ahead of the oxidation front to create the heavily doped regions 12, 13, 16, 17 and 18.

Next the remaining nitride layer 32 is removed by an etchant which attacks nitride but not silicon oxide, then the oxide 31 is removed by etching and the exposed silicon cleaned. The gate oxide 19 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for first polysilicon to silicon contacts, if needed, are patterned and etched at this point using photoresist; none are needed in the ROM array itself or the peripheral transistor shown.

As seen in FIG. 4c a first layer of polycrystalline silicon is deposited over the entire slice in a reactor using standard techniques. In one method for programming, an ion implant penetrates this layer of polysilicon, so the thickness is only about 3000 Angstroms, compared to about 5000 in the usual silicon gate process. This polysilicon layer is doped with phosphorus by an N+ diffusion to make it highly conductive. The polysilicon layer is patterned by applying a layer of photoresist, exposing to ultraviolet light through a mask prepared for this purpose, developing, then etching both photoresist and exposed oxide. The remaining photoresist masks certain areas of the polysilicon to define alternate word lines such as the line 15, 15', etc. The unmasked polycrystalline silicon is etched away, so the resulting structure is seen in FIG. 4c.

Figure 4D:
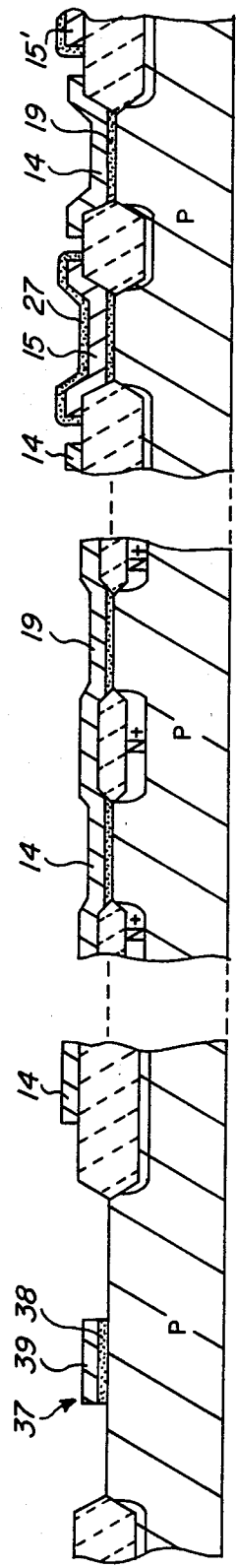

According to the invention, the lines 14, 14', etc. are applied in a separate polysilicon operation instead of in the same operation which defined the lines 15, 15', etc A thermal oxide coating 27 is first applied to the first level polysilicon as seen in FIG. 4d by exposing the slice to steam or an oxygen atmosphere at about 900 degrees C. for about one-half hour to produce a coating 27 of about 1000 Angstroms. This coating acts as an insulator in case the first and second level polysilicon overlaps, and also acts as an etch barrier when patterning the second level. Further, this thermal oxide is grown over silicon in the positions of the peripheral transistors such as the transistor 37 to function as the gate oxide 38. The second polysilicon is deposited by standard techniques to produce a layer of about 3000 Angstroms covering the entire slice. It is then patterned by photoresist to define the lines 14, 14', etc., as well as the gate 39 of the transistor 37 and other transistors and interconnections in the peripheral circuitry. Then, the thin thermal oxide 27 is removed over the peripheral transistor to define the gates, using the second level polysilicon as an etch mask so self-alignment is provided. Now the slice is subjected to a standard N+ diffusion operation to produce the N+ source and drain regions 40 and 41 for the transistor 37, as well as other peripheral transistors. At the same time, the second level polysilicon including the lines 14, 14' and the gate 39 are heavily doped to render them conductive.

A thick layer 42 of silicon oxide is deposited by decomposition of silane at a low temperature, about 400 degrees C. This layer 42 insulates the metal level from the polycrystalline silicon level of interconnections, and is referred to as multilevel oxide. The multilevel oxide layer is now patterned by a photoresist operation, exposing the entire ROM array area, as well as a contact area 43 for a metal-to-polysilicon contact and a contact area 44 for a metal-to-silicon contact. These are of course merely illustrative; metal contacts and interconnections are used in the periphery of the chip in the input buffers, decoders, sense amplifiers, substrate pump, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves a metal strip 45 connecting the source 40 of N-channel silicon gate transistor 37 to the contact area 43 such as at one the of a polysilicon X address line 14.

If implant programming according to my U.S. Pat. No. 4,290,184 is to be used, up to this point in the process all slices are exactly the same as no programming has been done in the ROM array. The slices are processed routinely to this stage with no requirement for separate inventory controls and separate identification of each lot. An inventory of slices finished up through metal patterning may be maintained for quick response to custom orders for ROM codes.

In accordance with the invention of U.S. Pat. No. 4,290,184, the ROM array is programmed by first depositing the post-metal-oxide or protective oxide layer 21 over the entire slice, then patterning it by a photoresist mask and etch sequence using a unique mask which defines the ROM code. An aperture 22 is defined over each cell 10 to be programmed as a "0", and each cell 10 to be a "1" is left covered. The slice is then subjected to a boron implant at about 180 KeV to a dosage of about $10^{13}$ per sq. cm. The energy level and dosage are dependent upon the thicknesses of the oxide layer 19 and the polysilicon gates 11, as well as the change in threshold desired. At this level, the ion implant penetrates the polycrystalline silicon gate 11 and gate oxide 19 to create an implanted region 23 in the channel area. This implant raises the threshold voltage above about 5 V. Since the part operates on a supply voltage Vdd of 5 V., the full logic 1 level will not turn on the transistor. The transistors covered by the oxide 21 will not be implanted so will retain the usual threshold voltage of about 0.8 V. It is important that the mask alignment for creating the apertures 22 for the programming mask is non-critical. The active channel area to be implanted has already been defined in previous processing step with thin gate oxide 19.

In operation, the X address selects one of the lines 14 or 15, or one of the other of the 256 such lines in a 64K ROM, and this selected line is held at logic 1 level or about +5 V. The remaining lines are held at Vss, logic 0. The Y address selects particular ones of the 256 lines such as 16, 17 and 18, depending upon partitioning, and these lines are connected via the Y decoder to the outputs, while an adjacent line is connected to Vss for each Y output line.

In the above description, the protective oxide 21 is used as the implant mask for programming. This results in the cells programmed 0 in the array being left without a covering of thick protective oxide or overcoat 21. This might be determined after a long period of time in some environments. Instead, photoresist may be used for the implant mask, this being done prior to deposition of the protective cover coating 21. After programming using resist, the oxide 21 is deposited in the conventional manner, and patterned to expose only the bonding pads.

Figure 4E:
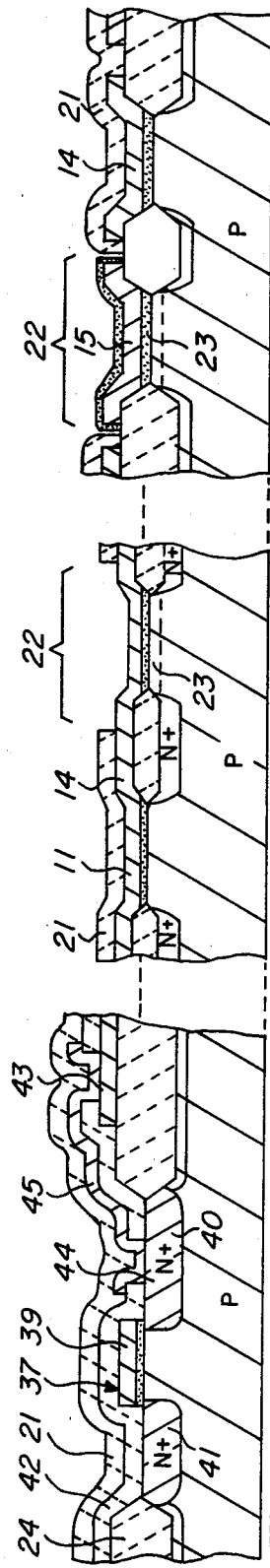

Instead of removing the multilevel oxide coating 38 from the entire cell array area as seen in FIG. 4e, it may be removed only over the gates of the transistors 10. This would provide additional protection.

The purpose of the ion implant for programming the cell array is to change the threshold voltage of some of the transistors 10 relative to the others, depending upon whether a 1 or a 0 is to be stored. A ROM cell can be either normally on or normally off when selected. The feature of this invention can be used in either P-channel or N-channel ROMs, so, depending on channel type and whether the cells are to be normally on or normally off when selected, the proper type of dopant for ion implant is determined. In the embodiment described in detail above, a boron implant is used to increase the threshold voltage such that a transistor 10 is off when selected. The normally on device can be either enhancement or depletion mode. In another example, such as the series ROM of U.S. Pat. No. 4,059,826 mentioned above, the ion implant would lower the threshold to depletion mode.

In the process described above, the peripheral transistors such as the transistor 37 are shown to be made by standard N-channel self-aligned silicon gate processing. Instead, the so-called "SATO" processing used for the ROM array could be used for the peripheral transistors as well, or both processes could be used. Instead of programming the ROM array by ion implant after the protective overcoating is in place, it could be programmed by ion implant after metallization but prior to protective overcoating, or after the polysilicon coatings but prior to the interlevel oxide coating, or prior to the polysilicon coatings. Also, the mask which defines the gate areas in the ROM array could be the programming mask, early in the process. The advantage of programming late in the process is that all manufacturing masks will be the same and all slices identical up to the point that the programming mask is introduced.

The concept of the invention could be used for metal lines instead of polysilicon, employing aluminum oxide in place of the thermal silicon oxide 27 as the insulating coating. Aluminum oxide can be formed by anodization. Also, the concept can be used for other devices such as RAM cell arrays, CCDs, etc. instead of the ROM array set forth.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making a read-only-memory comprising the steps of: forming a plurality of insulated gate field effect transistors in a face of a semiconductor body, each of the transistors having a source, a drain and a channel, the transistors being in a regular pattern of adjacent rows to provide an array of memory cells; applying a first pattern of conductive strips providing the gates of alternate rows of cells, and thereafter applying a second pattern of like conductive strips on said face parallel with and interleaved with the first pattern to provide the gates of the remaining rows of cells, the conductive strips of the first and second patterns being spaced closer to one another than the width of one of the conductive strips.

2. A method according to claim 1, wherein the field effect transistors are N-channel silicon gate transistors, and the conductive strips are formed by two layers of polycrystalline silicon deposited separately in thin films and patterned.

3. In a method of making a read-only-memory which includes the steps of:
   forming a plurality of insulated gate field effect transistors in a face of a semiconductor body, each of the transistors having a source, a drain and a gate, the transistors being in a regular pattern of adjacent rows to provide an array of memory cells; applying parallel strips of polycrystalline silicon to said face to provide the gates and row address lines; the improvement comprising the steps of:
   applying the strips of polycrystalline silicon in two separate steps, the first step including applying a film of polycrystalline silicon and patterning it to provide a first set of alternate rows, then coating the film with insulating material, and the second step including applying another film of polycrystalline silicon and patterning it to provide the remaining rows interleaved with said first set of alternate rows, wherein the spacing between the strips of polycrystalline silicon is much less than the width of the strips.

4. A method of making a semiconductor device comprising the steps of:
   forming a plurality of circuit elements in a pattern of adjacent rows at a face of a semiconductor body; and applying two separate patterns of interleaved conductive strips to said face to provide electrodes overlying the face, adjacent rows having overlying electrodes created of different ones of the two patterns, individual strips being wider than the spacing between strips.

5. A method according to claim 4 wherein a semiconductor device is a read-only-memory, the circuit elements are N-channel silicon gate transistors, the electrodes are formed by a first polysilicon layer deposited in a thin film and patterned prior to a second polysilicon layer deposited in a thin film and patterned.

6. A method of making a semiconductor device comprising the steps of:
   forming a plurality of circuit elements in a pattern of adjacent rows at a face of a semiconductor body; and applying two separate patterns of interleaved parallel conductive strips to said face over the circuit elements to provide electrodes of the circuit elements, adjacent rows having electrodes formed by different ones of the two patterns, by depositing a first film of conductive material and selectively removing parts of it to define a first pattern, coating the first pattern with insulating material, depositing a second film of conductive material and selectively removing parts of it to define a second pattern; wherein the spacing between the conductive strips is much less than the width of the individual strips.

7. A method according to claim 6 wherein a semiconductor device is a read-only-memory, the circuit elements are N-channel silicon gate transistors, and the electrodes are formed by polysilicon layer which comprises the first and second films.

* * * * *